United States Patent
Im (10) Patent No.: US 8,674,473 B2
(45) Date of Patent: Mar. 18, 2014

(54) SEMICONDUCTOR CELL AND METHOD FOR FORMING THE SAME

(75) Inventor: Song Hyeuk Im, Cheongju (KR)

(73) Assignee: Hynix Semiconductor Inc., Icheon (KR)

( * ) Notice: Subject to any disclaimer, the term of this patent is extended or adjusted under 35 U.S.C. 154(b) by 276 days.

(21) Appl. No.: 13/210,909

(22) Filed: Aug. 16, 2011

(65) Prior Publication Data
US 2012/0273919 A1   Nov. 1, 2012

(30) Foreign Application Priority Data

Apr. 27, 2011 (KR) .................. 10-2011-0039696

(51) Int. Cl.
*H01L 21/70* (2006.01)

(52) U.S. Cl.
USPC .... 257/522; 257/410; 257/276; 257/E21.573; 257/E21.581

(58) Field of Classification Search
USPC .......... 257/276, 410, 522, E23.013, E21.564, 257/E21.573, E21.581; 438/319, 411, 421, 438/619
See application file for complete search history.

(56) References Cited

U.S. PATENT DOCUMENTS

| 6,362,073 | B2 * | 3/2002 | Kim .............................. 438/422 |
| 6,472,266 | B1 * | 10/2002 | Yu et al. ....................... 438/241 |
| 6,492,245 | B1 * | 12/2002 | Liu et al. ....................... 438/422 |
| 7,064,379 | B2 * | 6/2006 | Kutsukake et al. ........... 257/315 |
| 7,462,905 | B2 * | 12/2008 | Imai et al. ..................... 257/316 |
| 7,655,969 | B2 * | 2/2010 | Takaishi ........................ 257/303 |
| 8,022,464 | B2 * | 9/2011 | Sato et al. ..................... 257/316 |
| 8,198,189 | B2 * | 6/2012 | Kim et al. ..................... 438/619 |
| 8,362,542 | B2 * | 1/2013 | Kang et al. .................... 257/315 |
| 2012/0202333 | A1 * | 8/2012 | Breitwisch et al. ........... 438/381 |

* cited by examiner

*Primary Examiner* — Cuong Q Nguyen
*Assistant Examiner* — Yosef Gebreyesus (57) ABSTRACT

A semiconductor cell includes storage node contact plugs disposed on a semiconductor substrate, a bit line formation area which is disposed between the storage node contact plugs and exposes the semiconductor substrate, and an air gap which is in contact with a lower portion of a sidewall of the bit line formation area and extends in a direction perpendicular to a direction in which the bit line formation area extends. Therefore, the coupling effect between adjacent bit lines as well as the coupling effect caused between adjacent storage node contact plugs and the coupling effect caused between the storage node contact plug and the bit line are controlled to improve characteristics of semiconductor devices.

5 Claims, 10 Drawing Sheets

CELL ARRAY

SEMICONDUCTOR CELL AND METHOD FOR FORMING THE SAME

CROSS-REFERENCES TO RELATED APPLICATION

The present application claims priority to Korean patent application number 10-2011-0039696 filed on 27 Apr. 2011, which is incorporated by reference in its entirety.

BACKGROUND OF THE INVENTION

1. Technical Field

The present invention relates to a semiconductor cell and a method of forming the same, and more particularly, to a semiconductor cell including a horizontal air gap disposed at a lower portion of a sidewall of a storage node contact plug.

2. Related Art

Most electric appliances include semiconductor devices. Semiconductor devices include electric elements such as transistors, resistors, capacitors and the like. The electric elements are designed to perform partial functions of the electric appliances and are integrated on a semiconductor substrate. For example, electronic appliances such as computers or digital cameras include memory chips for storing information and processing chips for controlling the information, and the memory chips and processing chips include the electric elements integrated on a semiconductor substrate.

On the other hand, semiconductor devices need to be more highly integrated to satisfy user demands for good performance and low price. As the integration degree of semiconductor devices increases, the design rule is scaled down and patterns of the semiconductor devices become fine. As semiconductor devices become extra miniaturizated and more highly integrated, although total chip area increases in proportion to the increase in memory capacity, a cell area where patterns of semiconductor devices are formed is substantially reduced. Since the number of patterns formed in the limited cell area must be maximized to ensure the desired memory capacity, fine patterns having a reduced critical dimension have to be formed.

On the other hand, semiconductor devices are designed to fit specific purposes by implanting impurities into a silicon wafer or depositing a new material on the silicon wafer, or the like. The semiconductor devices include many elements such as transistors, capacitors, or resistors and the elements are connected to each other to receive or transmit data or signals.

In order to improve the integrity of a semiconductor device, dimensions of components within the semiconductor device have to be scaled down, and lengths and widths of interconnections have to be reduced. For example, a word line for transferring a control signal and a bit line for transferring data are used as interconnections within a semiconductor memory device. When widths or cross-sectional sizes of the word line and the bit line are reduced, resistance, which interrupts the transmission of the control signal or data, is increased. Such increased resistance deteriorates transmission speed of signals or data within the semiconductor device, increases power consumption, and further damages operation stability of the semiconductor memory device.

In contrast, when the widths of the word line and the bit line are maintained to be as large as in the related art to prevent increase in the resistance, the physical distance between adjacent word lines or between bit lines becomes closer. In this case, when a spacer is formed to electrically isolate the bit line and the storage node contact plug, a coupling effect between the bit line and the storage node contact plug increases and the coupling effect causes parasitic capacitance of the bit line to increase, thereby deteriorating sensing capability. This disturbs the data and prevents it from being smoothly transferred through the bit line. Thus the semiconductor memory device cannot output data stored in a unit cell.

A method has been proposed to increase amounts of charges corresponding to data output from the unit cell in order to solve the problem due to the increase of the parasitic capacitance in the bit line, but a size of a capacitor within a unit cell of a semiconductor memory device has to be increased to obtain this result. However, as the integrity of the semiconductor memory device increases, an area occupied by the capacitor within the semiconductor memory device shrinks. That is, there is a limit to increasing the size of the capacitor within a unit cell in a highly integrated semiconductor memory device.

SUMMARY

The present invention is directed to providing a semiconductor cell and a method of forming the same, which prevents cell characteristics from degrading because of an increase of parasitic capacitance of a bit line due to a closer distance between the bit line and a storage node contact plug resulting from the high integration of a semiconductor and prevents operation characteristics from degrading because of the degradation of the cell characteristics.

According to one aspect of an exemplary embodiment, a semiconductor cell includes storage node contact plugs coupled to a semiconductor substrate including a cell area; a bit line formed between the storage node contact plugs and coupled to the substrate; and an air gap formed at a lower portion of a sidewall of the bit line and extending in a first direction perpendicular to a direction in which the bit line extends.

A thickness of the air gap is no more than one fifth of the bit line.

The semiconductor cell may further include a first insulating layer formed in the semiconductor substrate below the air gap; and a second insulating layer formed over the air gap.

The first and second insulating layers may include a silicon nitride layer.

The semiconductor cell may further include a spacer formed between the bit line and the storage node contact plug.

The semiconductor cell may include a barrier metal layer formed between the air gap and the bit line.

According to another aspect of an exemplary embodiment, a method of forming a semiconductor cell includes forming storage node contact plugs insulated from each other by an interlayer insulating layer formed over a semiconductor substrate; forming a bit line trench by etching the interlayer insulating layer between the storage node contact plugs; forming an air gap at a bottom portion of the bit line trench and extending in a direction perpendicular to a direction in which the bit line extends; forming a bit line contact hole extending from the bottom portion of the bit line trench by etching the semiconductor substrate; and forming a barrier metal layer over the bit line contact hole, over the bit line trench, and over a sidewall of the air gap.

The method may further include, before forming the storage node contact plugs, forming a gate electrode coupled to the semiconductor substrate; forming a first insulating layer over the semiconductor substrate and the gate electrode; and forming an oxide layer, a second insulating layer, and the interlayer insulating layer over the first insulating layer.

The forming the storage node contact plugs may include forming storage node contact holes by etching the interlayer insulating layer, the second insulating layer and the oxide layer to expose the semiconductor substrate; and filling a conductive material in the storage node contact holes.

The forming the bit line formation area may include forming a hard mask pattern defining the bit line trench over the interlayer insulating layer; and etching the interlayer insulating layer and the second insulating layer using the hard mask pattern as a mask to expose the oxide layer.

The method may further include, after the forming the bit line formation area, forming a spacer over the bit line trench; and etching the spacer to expose the oxide layer at the bottom of the bit line trench.

The forming the air gap may include removing the oxide layer exposed at the bottom of the bit line trench.

The removing the oxide layer may include performing wet etching for the oxide layer.

The removing the oxide layer may include using a buffered oxide etchant (BOE) solution.

The removing the oxide layer may include forming a space between a region between the bit line formation area and the storage node contact plug and a region between the storage node contact plugs formed adjacent to each other.

The forming the barrier metal layer may include a physical vapor deposition method.

According to another aspect of another exemplary embodiment, a method of forming a semiconductor cell includes forming a sacrificial layer over a substrate; forming a first insulation layer over the sacrificial layer; forming a storage node pattern passing through the first insulation layer and the sacrificial layer; forming a bit line trench between neighboring storage node patterns to expose the sacrificial layer; removing the sacrificial layer at the bottom of the bit line trench; forming a lining insulation pattern over a surface of the bit line trench to form an air gap between the storage node pattern and the lining insulation pattern; and forming a bit line pattern filling the bit line trench.

According to another aspect of an exemplary embodiment, a cell array includes a transistor including a semiconductor cell and a storage unit connected to the transistor. The semiconductor cell includes storage node contact plugs disposed on a semiconductor substrate, a bit line formation area disposed between the storage node contact plugs and configured to expose the semiconductor substrate, and an air gap coupled to a lower portion of a sidewall of the bit line formation area and extending in a direction perpendicular to a direction in which the bit line formation area extends.

According to another aspect of an exemplary embodiment, a semiconductor device includes a cell array, a row decoder connected to the cell array, a column decoder connected to the cell array, and a sense amplifier connected to the column decoder. The cell array includes a transistor including a semiconductor cell and a storage unit. The semiconductor cell includes storage node contact plugs disposed on a semiconductor substrate, a bit line formation area disposed between the storage node contact plugs and configured to expose the semiconductor substrate, and an air gap coupled to a lower portion of a sidewall of the bit line and extending in a direction perpendicular to a direction in which the bit line formation area extends.

According to another aspect of an exemplary embodiment, a semiconductor module includes a semiconductor device, a command link that allows the semiconductor device to receive a control signal from an external controller, and a data link coupled to semiconductor device and configured to transfer data to the semiconductor device. The semiconductor device includes a cell array, a row decoder, a column decoder, and a sense amplifier. The cell array includes a transistor including a semiconductor cell and a storage unit. The semiconductor cell includes storage node contact plugs disposed on a semiconductor substrate, a bit line formation area disposed between the storage node contact plugs and configured to expose the semiconductor substrate, and an air gap coupled to a lower portion of a sidewall of the bit line formation area and extending in a direction perpendicular to a direction in which the bit line extends.

According to another aspect of an exemplary embodiment, a semiconductor system includes a semiconductor module and a controller. The semiconductor module includes a semiconductor device, a command link, and a data link. The semiconductor device includes a cell array, a row decoder, a column decoder, and a sense amplifier. The cell array includes a transistor including a semiconductor cell and a storage unit. The semiconductor cell includes storage node contact plugs disposed on a semiconductor substrate, a bit line formation area disposed between the storage node contact plugs and configured to expose the semiconductor substrate, and an air gap coupled to a lower portion of a sidewall of the bit line formation area and extending in a direction perpendicular to a direction in which the bit line formation area extends.

According to another aspect of an exemplary embodiment, an electronic unit includes a semiconductor system and a processor. The semiconductor system includes a semiconductor module and a controller. The semiconductor module includes a semiconductor device, a command link, and a data link. The semiconductor device includes a cell array, a row decoder, a column decoder, and a sense amplifier. The cell array includes a transistor including a semiconductor cell and a storage unit. The semiconductor cell includes storage node contact plugs disposed on a semiconductor substrate, a bit line formation area disposed between the storage node contact plugs and configured to expose the semiconductor substrate, and an air gap coupled to a lower portion of a sidewall of the bit line formation area and extending in a direction perpendicular to a direction in which the bit line formation area extends.

The processor may include a central processing unit (CPU) or a graphic processing unit (GPU).

The CPU may include a computer or a mobile.

The GPU may include a graphic.

According to another aspect of an exemplary embodiment, an electronic system includes an electronic unit and an interface. The electronic unit includes a semiconductor system and a processor. The semiconductor system includes a semiconductor module and a controller. The semiconductor module includes a semiconductor device, a command link, and a data link. The semiconductor device includes a cell array, a row decoder, a column decoder, and a sense amplifier. The cell array includes a transistor including a semiconductor cell and a storage unit. The semiconductor cell includes storage node contact plugs disposed on a semiconductor substrate, a bit line formation area disposed between the storage node contact plugs and configured to expose the semiconductor substrate, and an air gap coupled to a lower portion of a sidewall of the bit line formation area and extending in a direction perpendicular to a direction in which the bit line formation area extends.

The interface may include any one of a monitor, a key board, a pointing device (mouse), universal serial bus (USB), a display, and a speaker.

These and other features, aspects, and embodiments are described below in the section entitled "DESCRIPTION OF EXEMPLARY EMBODIMENT."

BRIEF DESCRIPTION OF THE DRAWINGS

The above mentioned features and advantages of the subject matter of the present disclosure will be more clearly understood from the following detailed description with reference to the accompanying drawings, in which.

DESCRIPTION OF EXEMPLARY EMBODIMENT

Exemplary embodiments are described herein with reference to cross-sectional illustrations that are schematic illustrations of exemplary embodiments (and intermediate structures). As such, variations in shapes resulting from, for example, different manufacturing techniques and/or tolerances are to be expected. Thus, exemplary embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

Hereinafter, exemplary embodiments of the present invention will be described in detail with reference to the accompanying drawings.

Figure 1:
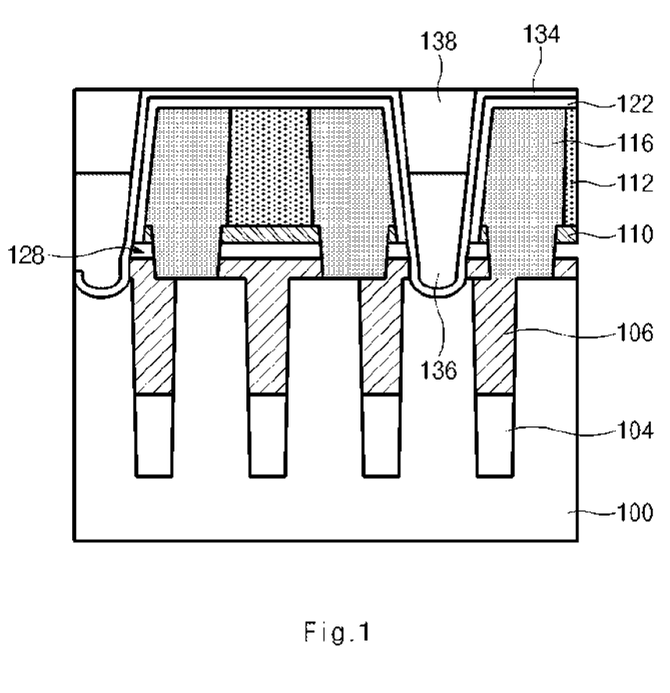
FIG. 1 is a cross-sectional view illustrating a semiconductor cell according to an exemplary embodiment of the present invention.

FIG. 1 is a cross-sectional view illustrating a semiconductor cell according to an exemplary embodiment. Referring to FIG. 1, the semiconductor cell according to an exemplary embodiment includes storage node contact plugs 116 disposed over a semiconductor substrate 100, a bit line 136 disposed between the storage node contact plugs 116 and coupled to the semiconductor substrate 100, an insulating layer 138 disposed over the bit line 136, and an air gap 128 which extends in a direction perpendicular to a direction in which the bit line 136 extends. The air gap 128 is formed between the bit lines 136 and between the storage node contact plugs 116. In an embodiment, a thickness of the air gap 128 may be one fifth or less of the bit line 136.

In an embodiment, a first insulating layer 106 may be disposed in the semiconductor substrate 100 below the air gap and a second insulating layer 110 may be disposed over the air gap. At this time, the first insulating layer 106 may be buried within the semiconductor substrate 100. The first insulating layer 106 is formed over a gate electrode 104. The first and second insulating layers 106 and 110 may include nitride layers, respectively. The semiconductor cell may further include an interlayer insulating layer 112 that electrically insulates the storage node contact plugs 116, a spacer 122 disposed at a sidewall of the storage node contact plugs 116, and a bit line barrier metal layer 134 disposed over the semiconductor substrate 100, a sidewall of the air gap 128, and the spacer 122.

According to an exemplary embodiment as described above, the air gap extends in a horizontal direction and is included to remove the coupling effect between adjacent bit lines, the coupling effect between adjacent storage node contact plugs, and the coupling effect between a storage node contact plug and a bit line. Thereby, the parasitic capacitance of the bit line is reduced to improve characteristics of the semiconductor device.

A method of forming a semiconductor cell having the above-described configuration according to an exemplary embodiment of the present invention will be described below. FIGS. 2A to 2F are cross-sectional views illustrating a method of forming a semiconductor cell according to an exemplary embodiment of the present invention.

Figure 2A:
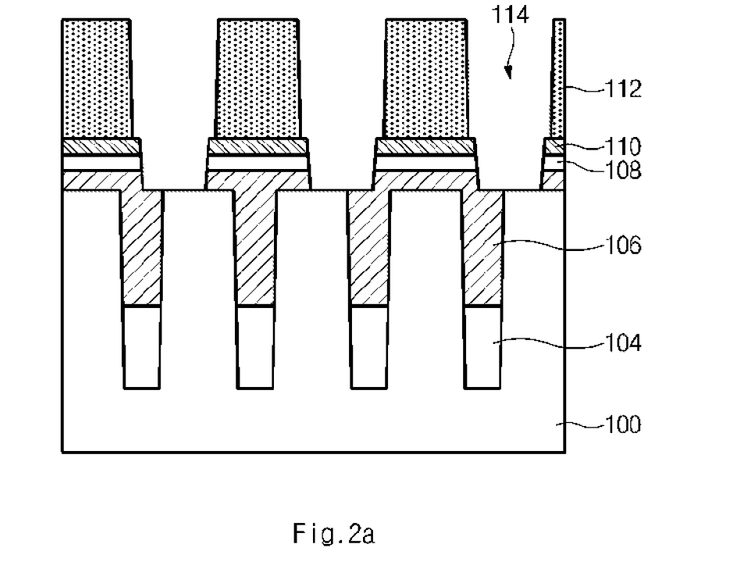
FIGS. 2A to 2F are cross-sectional views illustrating a method of forming a semiconductor cell according to an exemplary embodiment of the present invention.

Referring to FIG. 2A, a semiconductor substrate 100 is etched to form a trench and then a conductive layer is formed to fill the trench. An etch back process for the conductive layer is performed to form a gate electrode 104 at a lower portion of the trench. Subsequently, a first insulating layer 106, an oxide layer 108, and the second insulating layer 110 are formed over the gate electrode 104 and the semiconductor substrate 100. In an embodiment, the first insulating layer 106 and the second insulating layer 110 may include a nitride layer. Subsequently, an interlayer insulating layer 112 is formed over the second insulating layer 110. A photoresist pattern (not shown) defining storage node contact holes is formed over the interlayer insulating layer 112. Then, the interlayer insulating layer 112, the second insulating layer 110, the oxide layer 108, and the first insulating layer 106 are etched using the photoresist pattern as a mask to expose the semiconductor substrate 100, thereby forming storage node contact holes 114.

Figure 2B:
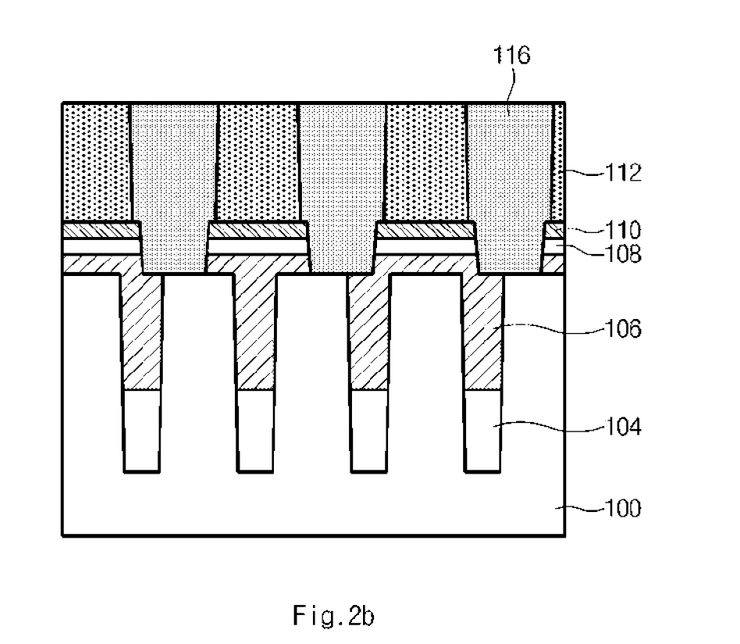

Referring to FIG. 2B, a conductive layer fills the storage node contact holes 114 and a planarization process is performed to expose the interlayer insulating layer 112, thereby forming storage node contact plugs 116.

Figure 2C:
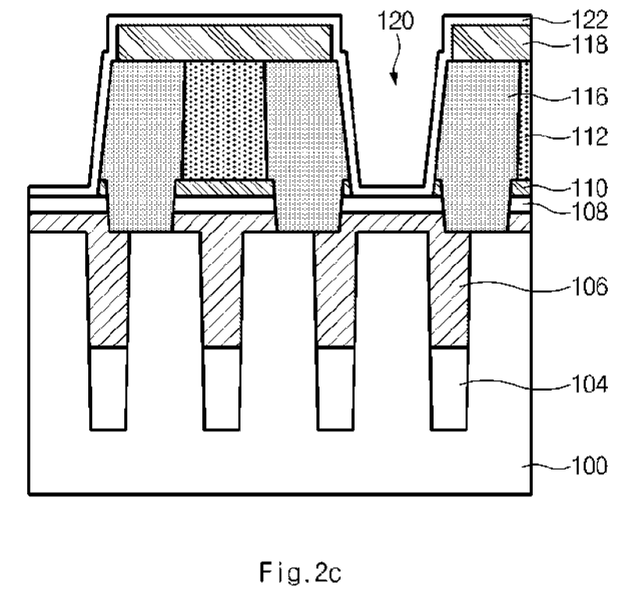

Referring to FIG. 2C, a hard mask pattern 118 defining a bit line is formed over the interlayer insulating layer 112 and the storage node contact plugs 116. Then the interlayer insulating layer 112 is etched using the hard mask pattern 118 as a mask to expose the first insulating layer 108, thereby forming a bit line formation area 120. Subsequently, a spacer 122 is formed on the bit line formation area 120. The spacer 122 may include a nitride layer. Afterward, the hard mask pattern 118 is removed.

Figure 2D:
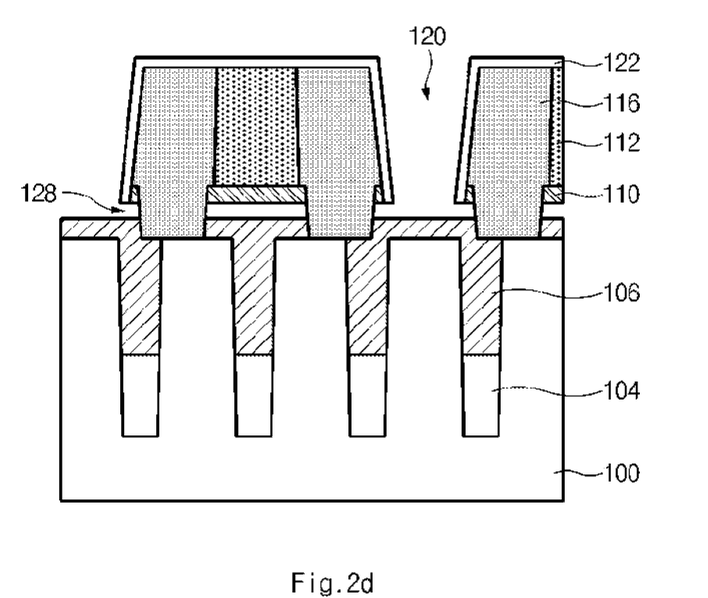

Referring to FIG. 2D, an etching process for the spacer 122 is performed to expose the first insulating layer 106, thereby removing a portion of the spacer 122 disposed over the bit line formation area 120 and the oxide layer 108. In an embodiment, an etching process for removing the oxide layer 108 may include a wet etching process. In more detail, the oxide layer 108 may be removed using a HF-based etchant, for example, a buffered oxide etchant (BOE: compound of $NH_4H$ and HF). By removing the oxide layer 108, an air gap 128 is formed that extends in a direction (a horizontal direction in FIG. 2D) perpendicular to a direction in which the bit line extends. That is, by removing the oxide layer 108, a space is formed between the storage node contact plugs 116 over the first insulation layer 106 and a space is also formed between a bottom of the bit line formation area 120 and the storage node contact plug 116. Thereby, the coupling effect between adjacent bit lines can be prevented. In addition, the coupling effect between the bit line and the storage node contact plug and the coupling effect between adjacent storage node contact plugs can also be controlled. That is, when the air gap 128 is formed only at a sidewall of the bit line contact plug, only the coupling effect between a bit line and a storage node can be prevented. However, in an exemplary embodiment, since the air gap is formed to extend horizontally, the coupling effect between adjacent bit lines as well as the coupling effect between other structural elements can be controlled. Therefore, the parasitic capacitance of the bit line can be easily reduced to improve sensing capability so that data can be smoothly transferred to or from the bit line. The air gap 128, extending horizontally, is formed after the spacer 122 is formed as described above, but the air gap 128 may also be formed after a bit line contact hole 130 is formed.

Figure 2E:
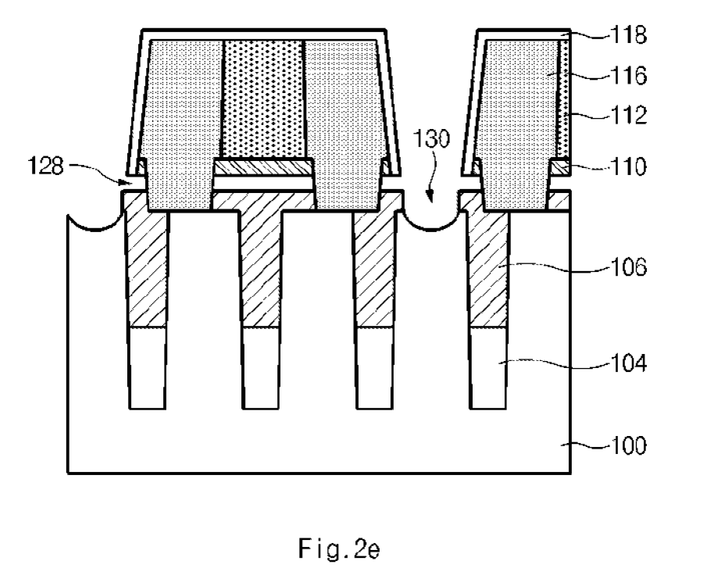

Referring to FIG. 2E, the exposed first insulating layer 106 and the semiconductor substrate 100 are partially etched to form a bit line contact hole 130. When the bit line contact hole 130 is formed after the air gap 128 is formed, the bit line formation area 120 extends downwards by the air gap 128 and the bit line contact hole 130 is formed in such a manner that it extends below the air gap 128. Thus, the bit line contact hole 130 is formed to easily prevent cell resistance from increasing.

Figure 2F:
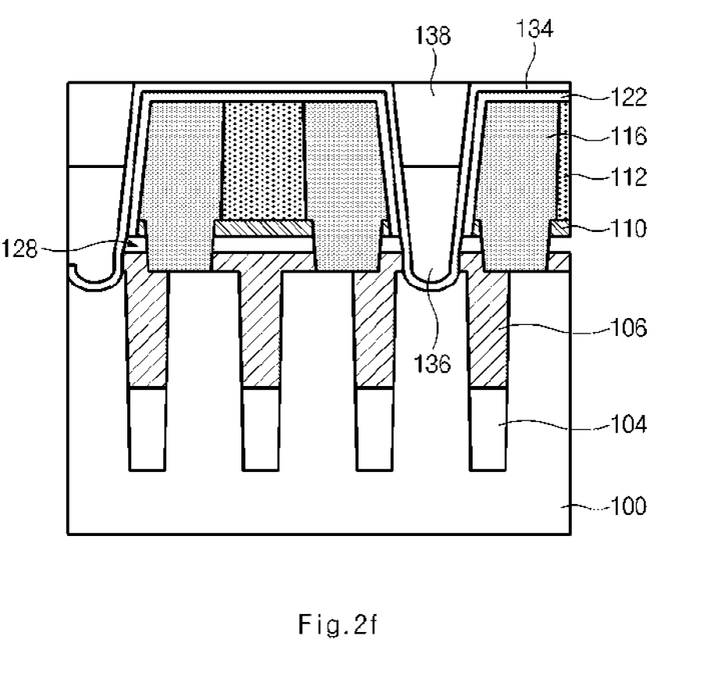

Referring to FIG. 2F, a barrier metal layer 134 for a bit line is formed over a surface of the bit line contact hole (130 of FIG. 2E) and the bit line formation area (120 of FIG. 2D). Then, conductive material for a bit line is formed to fill a lower part of the bit line formation area (120 of FIG. 2D) and the bit line contact hole (130 of FIG. 2E). An etch back process for the conductive material is performed to form a bit line 136 in the bit line contact hole (130 of FIG. 2E) and a portion of the bit line formation area (120 of FIG. 2D). Subsequently, an insulating layer 138 fills an upper part of the bit line formation area (120 of FIG. 2D). In an embodiment, the barrier metal layer 134 for a bit line may include a stacking structure of a titanium (Ti) layer and a titanium nitride (TiN) layer and may be formed by a physical vapor deposition (PVD) method. Since a thin film layer formed by a PVD method has a poor step coverage, when the barrier metal layer 134 for a bit line is formed by the PVD method, the barrier metal layer 134 is formed such that the air gap 128 between the bit line 136 and the storage node contact plugs 116 remains.

As described above, according to an exemplary embodiment, the air gap is formed to extend horizontally so that the parasitic capacitance of the bit line is reduced, and the characteristics of the semiconductor devices can be improved. Further, the coupling effect between the storage node contact plugs and the coupling effect between the bit line and the storage node contact plugs, in addition to the coupling effect between the bit lines, are controlled by the air gap.

Figure 3:
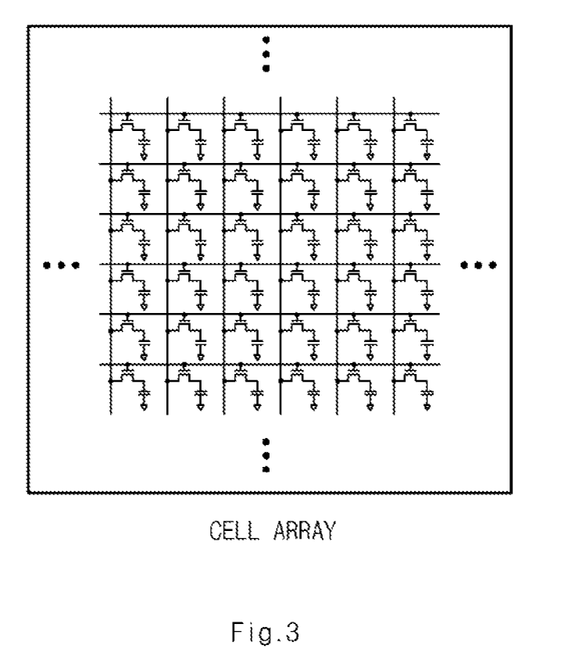
FIG. 3 is a view illustrating a cell array according to an exemplary embodiment of the present invention.

FIG. 3 is a view illustrating a memory cell array according to an exemplary embodiment of the present invention. Referring to FIG. 3, the memory cell array according to an exemplary embodiment includes a transistor including a semiconductor cell (see FIG. 1) and a storage unit. Although not shown, in a semiconductor cell according to an exemplary embodiment, the transistor may be arranged at an intersection of a bit line and a word line. The bit line and word line allow the data to be stored or to be output in response to voltages applied to the column decoder and the row decoder connected to the memory cell array. For reference, the bit line may be formed to extend in a first direction and the word line may be formed to extend in a second direction perpendicular to the first direction. A first terminal (for example, a drain terminal) of the transistor may be connected to the bit line, a second terminal (for example, a source terminal) is connected to the storage unit, and a third terminal (for example, a gate terminal) may be a word line.

Figure 4:
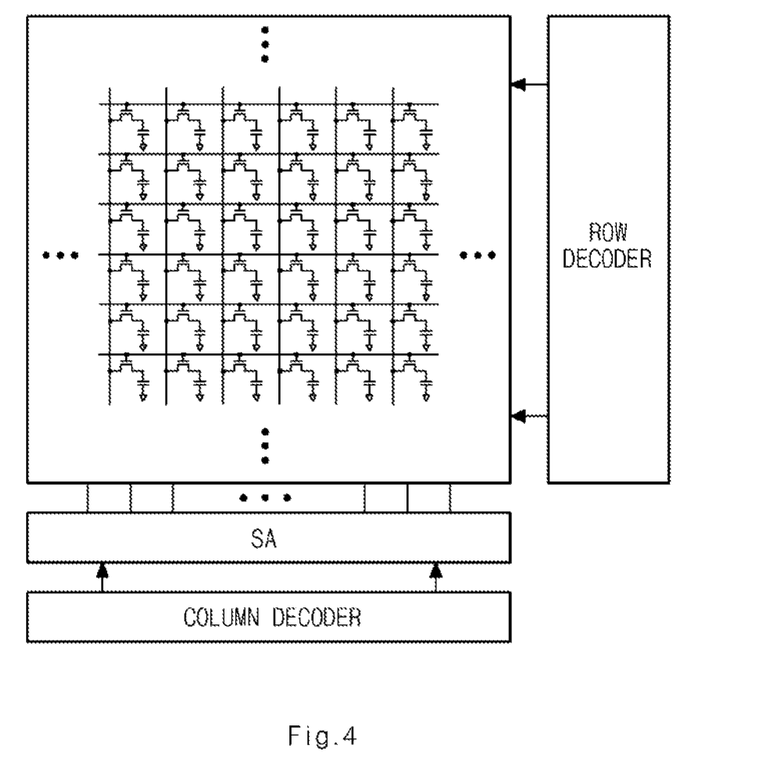
FIG. 4 is a view illustrating a semiconductor device according to an exemplary embodiment of the present invention.

FIG. 4 is a view illustrating a semiconductor device according to an exemplary embodiment of the present invention. Referring to FIG. 4, the semiconductor device may include a memory cell array, a row decoder, a column decoder, and a sense amplifier. In an embodiment, the memory cell array has the same structure as the memory cell array of FIG. 3. The row decoder selects a word line coupled to a target memory cell by applying a word line select signal to the memory cell array. The column decoder selects a bit line coupled to the target memory cell by applying a bit line select signal to the memory cell array. Further, the sense amplifier senses data stored in the target memory cell selected by the row decoder and the column decoder.

The semiconductor device according to an exemplary embodiment may be applied to dynamic random access memories (DRAMs), but it is not limited thereto. It may also be applied to, for example, static random access memories (SRAMs), flash memories, ferroelectric random access memories (FeRAMs), magnetic random access memories (MRAMs), and phase change random access memories (PRAMs).

Semiconductor devices according to the present invention can be employed for desktop computers, portable computers, computing memories used in servers, graphics memories having various specs, and mobile communication devices. Further, the above-described semiconductor device may be employed for various digital devices, for example, mobile recording mediums such as memory stick, a multimedia card (MMC), a secure digital (SD), a compact flash (CF), an extreme digital (xD) picture card, a universal serial bus (USB) flash device as well as a MP3P, a portable multimedia player (PMP), a digital camera, a camcorder, a mobile phone, etc. A single type semiconductor device may be applicable to technology such as a multi-chip package (MCP), a disk on chip (DOC), or an embedded device. The single type semiconductor device may be also applicable to a CMOS image sensor, which is extensively employed, for example, for camera phones, web cameras, small-size image pick-up devices for medicine, etc.

Figure 5:
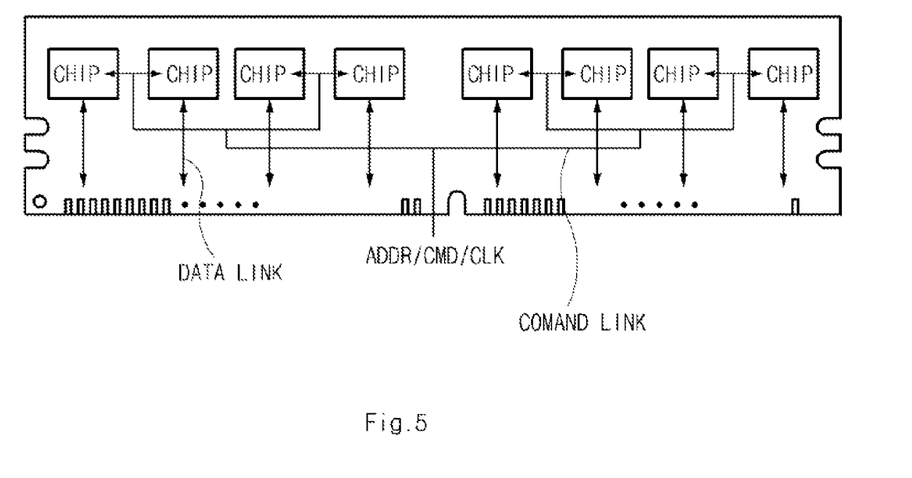
FIG. 5 is a view illustrating a semiconductor module according to an exemplary embodiment of the present invention.

FIG. 5 is a view illustrating a semiconductor module according to an exemplary embodiment of the present invention. Referring to FIG. 5, the semiconductor module of an exemplary embodiment includes semiconductor chips mounted on a module substrate, a command link that allows the semiconductor chips to receive control signals (address signal (ADDR), command signal (CMD), clock signal (CLK)) from an external controller (not shown), and a data link that is connected to the semiconductor chips and transfers data to/from the semiconductor chips. In an embodiment, the semiconductor chips can be the semiconductor device illustrated in FIG. 4. The command link and the data link can be configured in a conventional manner. Although FIG. 5 illustrates that semiconductor chips are mounted on a front of the semiconductor module substrate, the semiconductor chips can be mounted on a rear side of the module substrate in substantially the same manner as described above. That is, the semiconductor chips may be mounted on one side or both sides of the module substrate and the number of semiconductor chips mounted is not specifically limited. In addition, material and design of the module substrate are not limited to those shown in FIG. 5.

Figure 6:
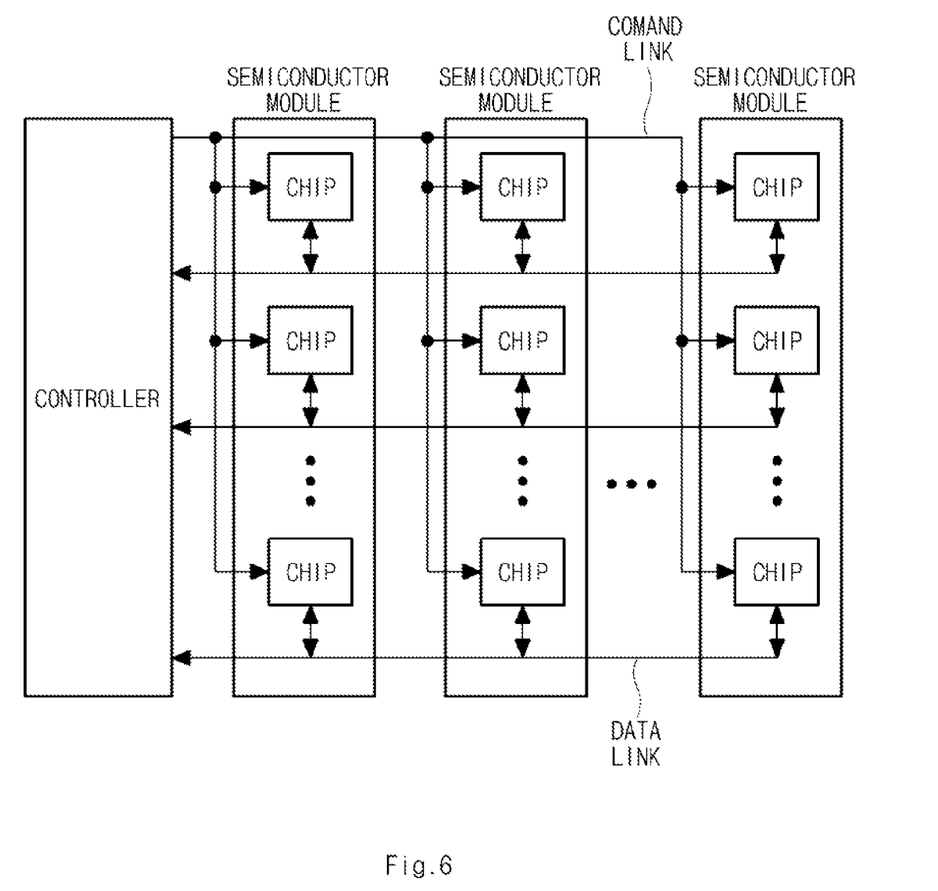
FIG. 6 is a view illustrating a semiconductor system according to an exemplary embodiment of the present invention.

FIG. 6 is a view illustrating a semiconductor system according to an exemplary embodiment of the present invention. Referring to FIG. 6, the semiconductor system of an exemplary embodiment includes: at least one semiconductor module on which a plurality of semiconductor devices (or chips) are mounted; and a controller which provides a bidirectional interface between the semiconductor module and an external system (not shown) to control an operation of the semiconductor module. The semiconductor system may further include a command link and a data link, which connect the semiconductor module and the controller. The controller controls an operation of a plurality of semiconductor modules in substantially the same manner as a conventional data processing system. Therefore, its detailed description in an exemplary embodiment will be omitted. In an embodiment, the semiconductor device of FIG. 4 may be used as the semiconductor device and the semiconductor module of FIG. 5 may be used as the semiconductor module.

Figure 7:
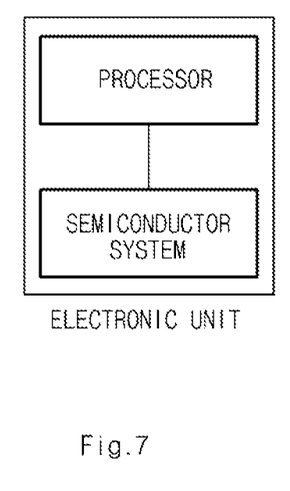
FIG. 7 is a view illustrating an electronic unit according to an exemplary embodiment of the present invention.

FIG. 7 is a view illustrating an electronic unit according to an exemplary embodiment. Referring to FIG. 7, the electronic unit according to an exemplary embodiment includes a semiconductor system and a processor electrically connected to the semiconductor system. Here, the processor includes a central processing unit (CPU), a microprocessor unit (MPU), a micro controller unit (MCU), a graphics processing unit (GPU) or a digital signal processor (DSP).

In an embodiment, the CPU or the MPU performs a combined function of an arithmetic logic unit (ALU), which is an arithmetic and logical operation unit, and a control unit, which reads and interprets commands to control individual units. When the processor is a CPU or MPU, the electronic unit may be employed for computer appliances or mobile appliances. Further, the GPU can be configured as a CPU, which is designed for graphics which uses to calculate numbers having a decimal point. The GPU is a processor which draws graphics on a screen in real time. When the processor is a GPU, the electronic unit may include graphic appliances. DSP converts an analog signal (for example, audio) into a digital signal, calculates the converted signal, and uses the calculated result or converts the calculated result into an analog signal again and uses the converted signal. The DSP typically operates to calculate digital values. When the processor is a DSP, the electronic unit may include audio and video appliances.

In addition, the processor includes an accelerate processor unit (APU). The processor has a combined configuration of a CPU, a GPU and a processor serving as a graphic card.

Figure 8:
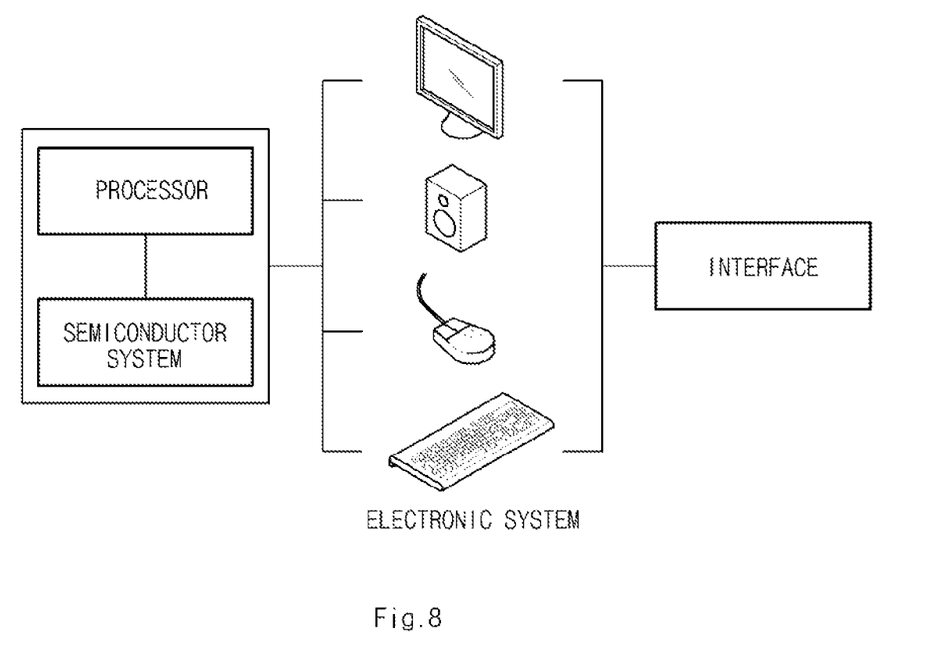
FIG. 8 is a view illustrating an electronic system according to an exemplary embodiment of the present invention.

As illustrated in FIG. 8, an electronic system includes an electronic unit and at least one of interfaces electrically connected to the electronic unit. The electronic unit of FIG. 7 may be used as the electronic unit. Here, the interface may include a monitor, a key board, a pointing device (mouse), USB, a display, or a speaker, but it is not limited thereto and it may be changeable.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

The present invention includes the following features;
1. A semiconductor cell, comprising:
storage node contact plugs coupled to a semiconductor substrate including a cell area;
a bit line formed between the storage node contact plugs and coupled to the substrate; and
an air gap formed at a lower portion of a sidewall of the bit line and extending in a first direction perpendicular to a direction in which the bit line extends.

2. A cell array, comprising:
a transistor including a semiconductor cell of claim 1; and
a storage unit coupled to the transistor.

3. A semiconductor device, comprising:
a cell array of claim 2;
a row decoder coupled to the cell array;
a column decoder coupled to the cell array; and
a sense amplifier coupled to the column decoder.

4. A semiconductor module, comprising:
a semiconductor device of claim 3;
a command link configured to transfer a control signal to and from the semiconductor device; and
a data link configured to transfer data to and from the semiconductor device.

5. A semiconductor system, comprising:
a semiconductor module of claim 4; and
a controller,
wherein the controller is configured to transmit the control signal from and to the semiconductor device via the command link, and is further configured to transmit data from and to the semiconductor device via the data link.

6. An electronic unit, comprising:
a semiconductor system of claim 5; and
a processor configured to control the semiconductor system.

7. The electronic unit of claim 6, wherein the processor includes a central processing unit (CPU) or a graphic processing unit (GPU).

8. The electronic unit of claim 7, wherein the central processing unit (CPU) is a desktop computer, a laptop computer, or a mobile electronic device.

9. The electronic unit of claim 7, wherein the graphic processing unit (GPU) is a graphic device.

10. An electronic system, comprising:
a electronic unit of claim 6; and
a interface.

11. The electronic system of claim 10, wherein the interface includes any one of monitor, a key board, a pointing device (mouse), universal serial bus (USB), a display, and a speaker.

What is claimed is:
1. A semiconductor cell, comprising:
storage node contact plugs coupled to a semiconductor substrate including a cell area;
a bit line formed between the storage node contact plugs and coupled to the substrate;
an air gap formed at a lower portion of a sidewall of the bit line and extending in a first direction perpendicular to a direction in which the bit line extends; and a barrier metal layer formed between the air gap and the bit line.

2. The semiconductor cell of claim 1, wherein a thickness of the air gap is no more than one fifth of the bit line.

3. The semiconductor cell of claim 1, the semiconductor cell further comprising:
a first insulating layer formed in the semiconductor substrate below the air gap; and
a second insulating layer formed over the air gap.

4. The semiconductor cell of claim 3, wherein the first and second insulating layers each includes a silicon nitride layer.

5. The semiconductor cell of claim 1, the semiconductor cell further comprising:

a spacer formed between the bit line and the storage node contact plug.

\* \* \* \* \*